United States Patent [19]
Park

[11] Patent Number: 5,646,902
[45] Date of Patent: Jul. 8, 1997

[54] STATIC RANDOM ACCESS MEMORY DEVICE WITH LOW POWER DISSIPATION

[75] Inventor: Jong Hoon Park, Kyungki-Do, Rep. of Korea

[73] Assignee: Goldstar Electron Co., Ltd., Cheongju, Rep. of Korea

[21] Appl. No.: 675,511

[22] Filed: Jul. 3, 1996

Related U.S. Application Data

[63] Continuation of Ser. No. 362,298, Dec. 22, 1994, abandoned.

[30] Foreign Application Priority Data

Oct. 20, 1994 [KR] Rep. of Korea ............... 26835/1994

[51] Int. Cl.$^6$ ........................................... G11C 13/00
[52] U.S. Cl. ..................... 365/227; 365/195; 365/226; 365/233.5
[58] Field of Search ............... 365/233.5, 189.11, 365/195, 226, 227

[56] References Cited

U.S. PATENT DOCUMENTS

| | | | |
|---|---|---|---|
| 4,947,379 | 8/1990 | Okuyama | 365/233.5 |
| 4,962,487 | 10/1990 | Suzuki | 365/233.5 |
| 5,329,491 | 7/1994 | Brown et al. | 365/227 X |
| 5,363,335 | 11/1994 | Jungroth et al. | 365/227 X |
| 5,406,064 | 4/1995 | Takahashi | 365/227 X |
| 5,420,528 | 5/1995 | Shigehara | 365/227 X |

*Primary Examiner*—Do Hyun Yoo
*Attorney, Agent, or Firm*—Fleshner & Kim

[57] ABSTRACT

A static random access memory device having a power-down timer for generating a power-down signal in response to a plurality of address transition detecting signals and data input detecting signals, a chip selection detecting signal and a write mode detecting signal, is disclosed. The device includes a power-up detector for generating a power-up signal to make the power-down detecting signal be conducted, the power-up detecting signal responding to a rising of a power supply voltage.

14 Claims, 8 Drawing Sheets

STATIC RANDOM ACCESS MEMORY DEVICE WITH LOW POWER DISSIPATION

This application is a continuation of application Ser. No. 08/362,298 filed Dec. 22, 1994 now abandoned.

BACKGROUND OF THE INVENTION

1. Field of the Invention

The present invention relates to a semiconductor memory device, and more particularly to a static random access memory device with a low power consumption.

2. Description of the Prior Art

In a static random access memory device (hereinbelow abbreviated to SRAM), generally, DC current flow between terminals of power source of the device continues during a read cycle or a write cycle. It is well known as the reason that the consume power in the SRAM is great. Thus the demand for the SRAM with a low power consumption has been increasing.

One solution to meet this demand, heretofore, has been disclosed in U.S. Pat. No. 4,962,487 issued Oct. 9, 1990 to Suzuki entitled STATIC RANDOM ACCESS MEMORY DEVICE WITH POWER DOWN FUNCTION describing a power down function to reduce the consume current during a write cycle, in which the period to execute an actual write operation is determined not by a period of write cycle which is determined by an external control signal but by a period that pulse signal generating means generates a pulse signal. The period for the actual write operation is forced to be changed to a period for a power down mode by the pulse signal generating means during the write cycle. In U.S. Pat. No. 4,947,379 issued Aug. 7, 1990 to Okuyama entitled HIGH SPEED STATIC RANDOM ACCESS MEMORY CIRCUIT, all word lines and the data output circuits coupled to the bit lines are disabled respectively after the word line enable pulse and the sense amplifier enable pulse were terminated, which reduces the current consumption just in the read cycle.

FIG. 1 shows a recent conventional circuit configuration for the low power consumption. In FIG. 1, a power down timer 15 receives a plurality of address transition detecting signals φATD1 to φATDk from an address transition detector 5, a chip selection detecting signal φCSD and a write mode detecting signal φWTD both from a chip selection/write mode detector 13 and a plurality of data input detecting signals φDTD1 to φDTDn from a data transition detector 33, so as to generate a power-down signal φPD with a pulse width established by a pulse elongation circuit 50 as shown in FIG. 2. As the power-down timer 15 employs NOR gates 42, 44 and 46 those receive the address transition detecting signals φATD1 to φATDk, the data input detecting signals φDTD1 to φDTDn, the chip selection signal φCSD and the write mode detecting signal φWTD, and further employs a NAND logic gate 48 which receives output signals from the NOR logic gates 42, 44 and 46, the power-down signal φPD may be changed into its complementary logic state in response to a transition with least one out of the detecting signals. As shown in FIG. 1, the power-down signal φPD is used for making a plurality of word lines WL1 to WLn be possible to be conductive thereby, for activating a write switching signal φSWE which connects a data input circuit 29 to a pair of data lines DL and/DL, for generating a sense amplifier enable signal φSAE and also for controlling the data input circuit 29. The read and write operations with the circuit of FIG. 1 will now be described referring to FIG. 3 a timing diagram. During the write cycle, a chip selecting signal CSB and a write enable signal WEB both retain low levels and an output enable signal OEB is high or low level. At the beginning of the write cycle, the chip selection detecting signal φCSD is raised to high level in response to the chip selecting signal CSB falling to low level, and the address transition detecting signal φATDi (i=1 to k) to high level in response to a transition of an address bit Ai (i=1 to k). The write mode detecting signal φWTD goes to high level in response to the write enable signal WEB falling to low level, and the data input detecting signal φDTDi (i=1 to n) to high level in response to a transition of an input data bit. Thus, the power-down signal φPD is generated from the power-down timer 15 shown in FIG. 2, according to the logic status of the detecting signals φCSD, φWTD, φATDi and φDTDi.

Since the word line WLi (i=1 to n) as a selected one can be activated while the power-down signal φPD having a predetermined pulse width established by the pulse elongation circuit 50 retains low level, an activation for the word line WLi is terminated when the power-down signal φPD is raised to high level. At this time, the data input circuit 29 is disabled and the write switching signal φSWE becomes low level. As a result, a current flowing toward the memory cells and from the data input circuit 29 is suspended therein.

In a read cycle in which the chip selecting signal CSB, the write enable signal WEB and the output enable signal OEB stay on low, high and low levels, respectively. And the sense amplifier enable signal φSAE is dependent upon the power-down signal φPD being placed on low level for a period by the predetermined pulse width. Therefore, as figured in the write cycle, the word line WLi which has been selected and the sense amplifier 35 are disabled after a latch operation with a data output buffer 37, responding to the power-down signal φPD rising to high level.

The circuit as illustrated in FIG. 1, however, has some problems relevant to an abnormal performance that would be revealed throughout the read cycle. Referring to FIG. 4 which shows timing configurations at an initial state when a power supply voltage is beginning to be applied from an external system, there are no transitions with the chip selecting signal CSB, the write enable signal WEB, the address bits, the output enable signal OEB, and with the input data bits. That phenomenon causes the detecting signals φATDi, φCSD, φWTD and φDTDi all not to be changed from their current states, right resulting in an inactivation of the power-down signal φPD. Thus, it may be impossible to write data into a memory cell corresponding to a normal address because any word line or data line can not be conductive due to the power-down signal's null condition. Predictable result is that abnormal data could be read out from inefficient memory cells during the read cycle.

SUMMARY OF THE INVENTION

It is therefore an object of the present invention to provide a static random access memory device with a low power dissipation during both cycles for reading and writing.

It is another object of the present invention to provide a static random memory device with a low power dissipation, being free from an abnormal data access operation during read and write cycles.

In order to achieve these and other objects, a static random access memory device having a power-down timer for generating a power-down signal in response to a plurality of address transition detecting signals and data input detecting signals, a chip selection detecting signal and a write mode detecting signal, includes a power-up detector for generating a power-up detecting signal to make the power-down signal be conducted, the power-up detecting signal responding to a rising of a power supply voltage.

The power-up detector includes a capacitor connected between the power supply voltage and a first node, a threshold switch connected between the first node and a second node, an inverter chain connected between the second node and an output terminal where the power-up detecting signal is generated therefrom, and a means for stabilizing an voltage level of the power-up detecting signal after a predetermined period.

The above, and other objects, features and advantages of the present invention will be apparent from the following detailed description of an illustrative embodiment that is to be read in connection with the accompanying drawings, in which the same reference numerals identify the corresponding elements and parts in the several diagrams.

DETAILED DESCRIPTION OF THE PREFERRED EMBODIMENTS

Figure 5:
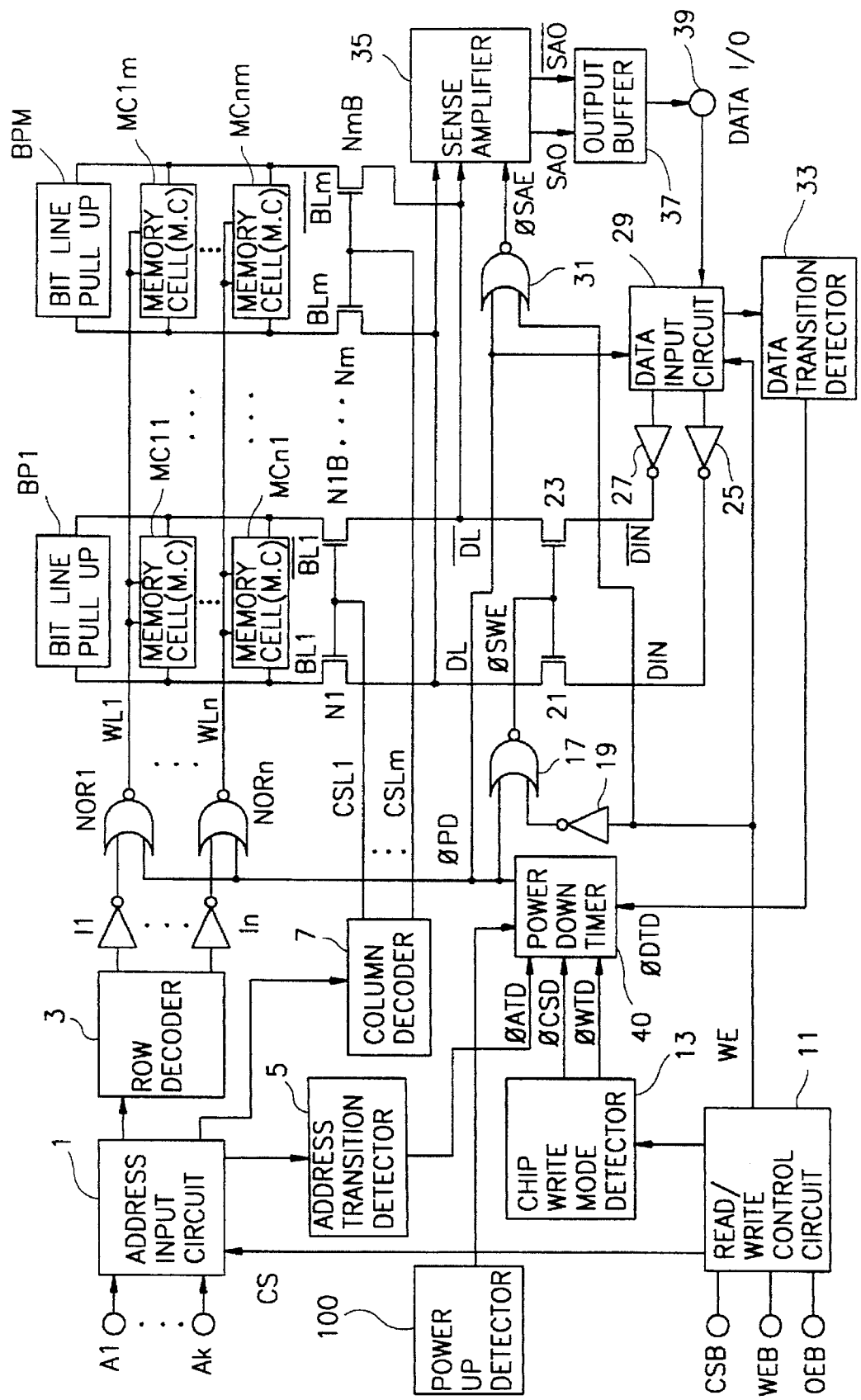
FIG. 5 is a functional block diagram of a static random access memory device according to the present invention.

Referring to FIG. 5, a static random access memory device according to the present invention has a power-up detector 100 which generates a power-up detecting signal φPWRUPB being applied to a power-down timer 40.

Figure 1:
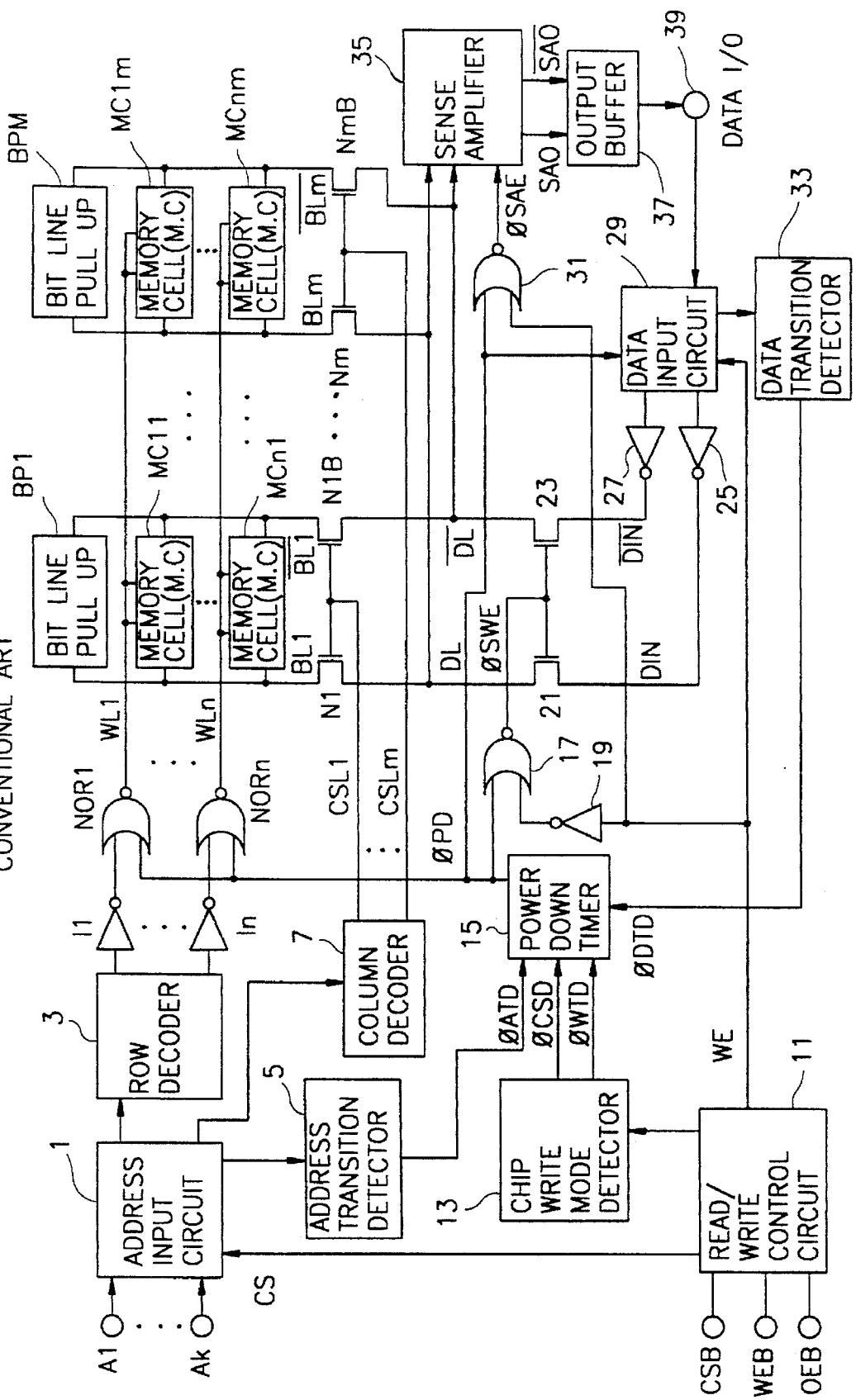
FIG. 1 is a functional block diagram of a conventional static random access memory device.

It will now be understood that other features in the circuit of FIG. 5, but the arrangements with the power-up detector 100 and the power-down timer 40, are the same with those of FIG. 1. Namely, a read/write control circuit 11 receiving a chip selecting signal CSB, a write enable signal WEB and an output enable signal OEB provides a chip selecting signal CS (this is a logically complementary signal of the CSB) to an address input circuit 1 and also provides a write enable signal WE (this is a logically complementary signal of the WEB) to a data input circuit 29. A chip-selection/write-mode detector 13 applies a chip selection detecting signal φCSD and a write mode detecting signal φWTD to the power-down timer 40, responding to a transition status of the chip selecting signal and write enable signal in the read/write control circuit 11. The address input circuit 1 receiving a plurality of address bits A1 to Ak provides an address to a row decoder 3 and a column decoder 7. An address transition detector 5 provides a plurality of address transition detecting signals φATD1 through φATDk to the power-down timer 40. The row decoder 3 provides a plurality of row decoding signals to a plurality of NOR gates NOR1 to NORn through a plurality of inverters I1 to In. The NOR gates NOR1 to NORn all receive a power-down signal φPD from the power-down timer 40. Each of output terminals of the NOR gates NOR1 to NORn is coupled to each of a plurality of word lines WL1 to WLn those are connected to a plurality of memory cells MC11, ..., MC1m, ..., MCn1, ..., MCnm (hereinafter referred to MC11 to MCnm). The column decoder 7 generates a plurality of column selecting signals CSL1 to CSLm each being applied to gates of a plurality of column selecting transistor pairs N1/N1B to Nm/NmB which are interposed between a plurality of bit-line pairs BL1/BL1B to BLm/BLmB and a pair of data line DL/DLB. A pair of data bits on the data line pair DL/DLB is transferred to a sense amplifier 35 which is controlled by a sense amplifier enable signal φSAE. A pair of sense ampmlifier output signals SAO/SAOB is transferred to a data input/output bus 39 through an output buffer 37. The sense amplifier enable signal φSAE is generated from a NOR gate 31 which receives the power-down signal φPD and the write enable signal WE. The write enable signal WE is also applied to a NOR gate 17 through an inverter 19, the NOR gate 17 further receiving the power-down signal φPD and thereby providing a write switching signal φSWE to gates of a selecting transistor pair 21/23 which are interposed the data line pair DL/DLB and a pair of data input lines DIN/DINB. On the data input line pair DIN/DINB a pair of input data bits from the data input circuit 29 is loaded through a pair of inverters 25/27. A data transition detector 33 responds to transitions of input data bits in the data input circuit 29 so as to generate a plurality of data input detecting signals φDTDI to φDTDn those are applied to the power-down timer 40.

Figure 6A:
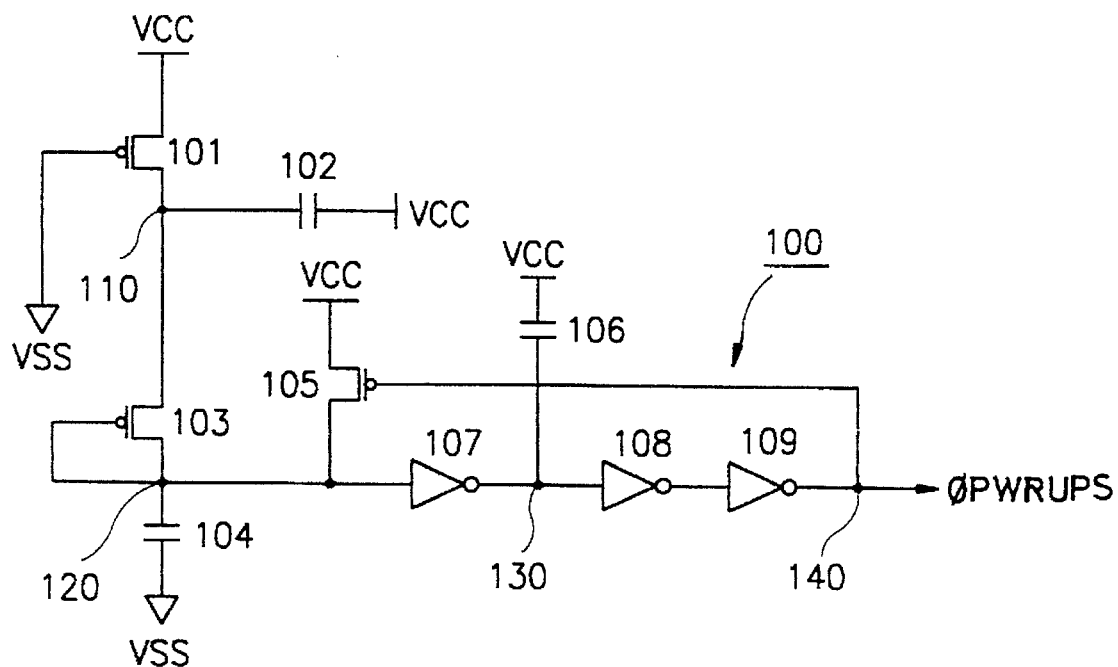
FIG. 6A is a circuit diagram of a power-up detector employed in the circuit of FIG. 5.

FIG. 6A shows an detail circuit configuration of the power-up detector 100 of FIG. 5 relevant to the present invention. A gate of a PMOS (P-channel metal-oxide-semiconductor) transistor 101 with a channel connected between a power supply voltage Vcc and a node 110 is coupled to a ground voltage Vss. Between the node 110 and the power supply voltage Vcc a capacitor 102 is coupled. Further to the node 110 a source of a PMOS transistor 103 is coupled. Both a gate and drain of the PMOS transistor 103 are connected to a node 120 in common, the node 120 being coupled to the ground voltage Vss through a capacitor 104. A gate of a PMOS transistor 105 with a channel being connected between the power supply voltage Vcc and the node 120 is connected to an output terminal 140 where the power-up detecting signal φPWRUPB is generated therein. The node 120 is led to a node 130 through an inverter 107, the node 130 being coupled to the power supply voltage Vcc through a capacitor 106. From the node 130 to the output terminal 140 two inverters 108 and 109 are connected in serial. The capacitors 102 and 106 are provided for making respectively the node 110 and 130 be charged to voltage levels being raised with slopes taken along with a rising of the power supply voltage Vcc.

Figure 6B:
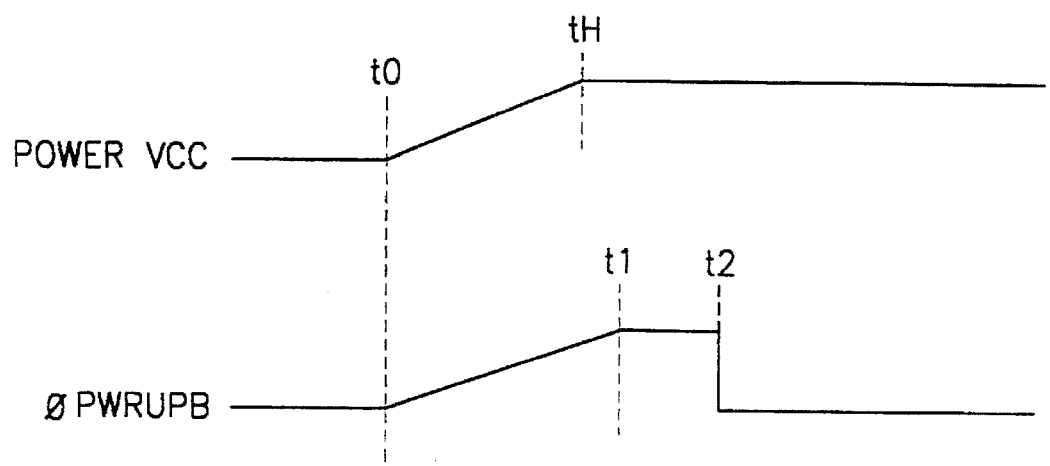
FIG. 6B shows voltage wave forms of a power-up detecting signal and a power supply voltage.

Referring to FIG. 6B, the power-up detecting signal φPWRUPB goes to high level with a slope while the power supply voltage Vcc is being raised to its own conducting level, from a time t0. Voltage levels on the node 110 and 130 are raised along the rising power supply voltage Vcc by means of the coupling effects of the capacitors 102 and 106, respectively. And the conductivity of the PMOS transistor 105 becomes lower due to the rising of the voltage level at the output terminal 140, while the power supply voltage Vcc is being raised to higher level until a time tH. If the power supply voltage Vcc has been arrived at a normally conducting level (high level in CMOS logic) at tH, the power-up detecting signal φPWRUPB which has followed the power supply voltage Vcc's rising becomes high level at a time t1. The appearance with an interval between the times tH and t1 is to regard what has been delayed by the inverters 108 and 109. At that time t1, the PMOS transistor 105 is heavily turned off. Meanwhile, if a voltage on the node 110 has not yet reached to a level enough to overcome a threshold voltage built in the PMOS transistor 103, the node 120 is placed on low level so that the power-up detecting signal φPWRUPB retains high level during a period from t1 to t2.

Thereafter, once a voltage level enough to turn on the PMOS transistor 103 appeares at the node 110, the node 120 becomes high level so as to make the power-up detecting signal φPWRUPB fall to low level at t2. By the output terminal 140 with low level, the PMOS transistor 105 is turned on so as to secure a stable generation with the "low-leveled" power-up detecting signal φPWRUPB after the t2.

Figure 2:
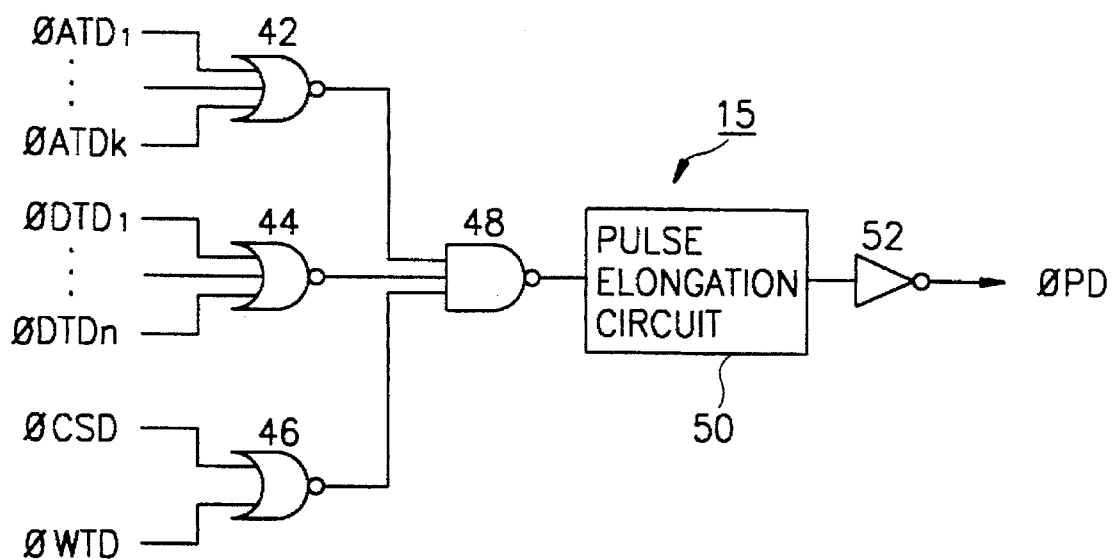
FIG. 2 is a circuit diagram of the power-down timer of FIG. 1.
Figure 3:
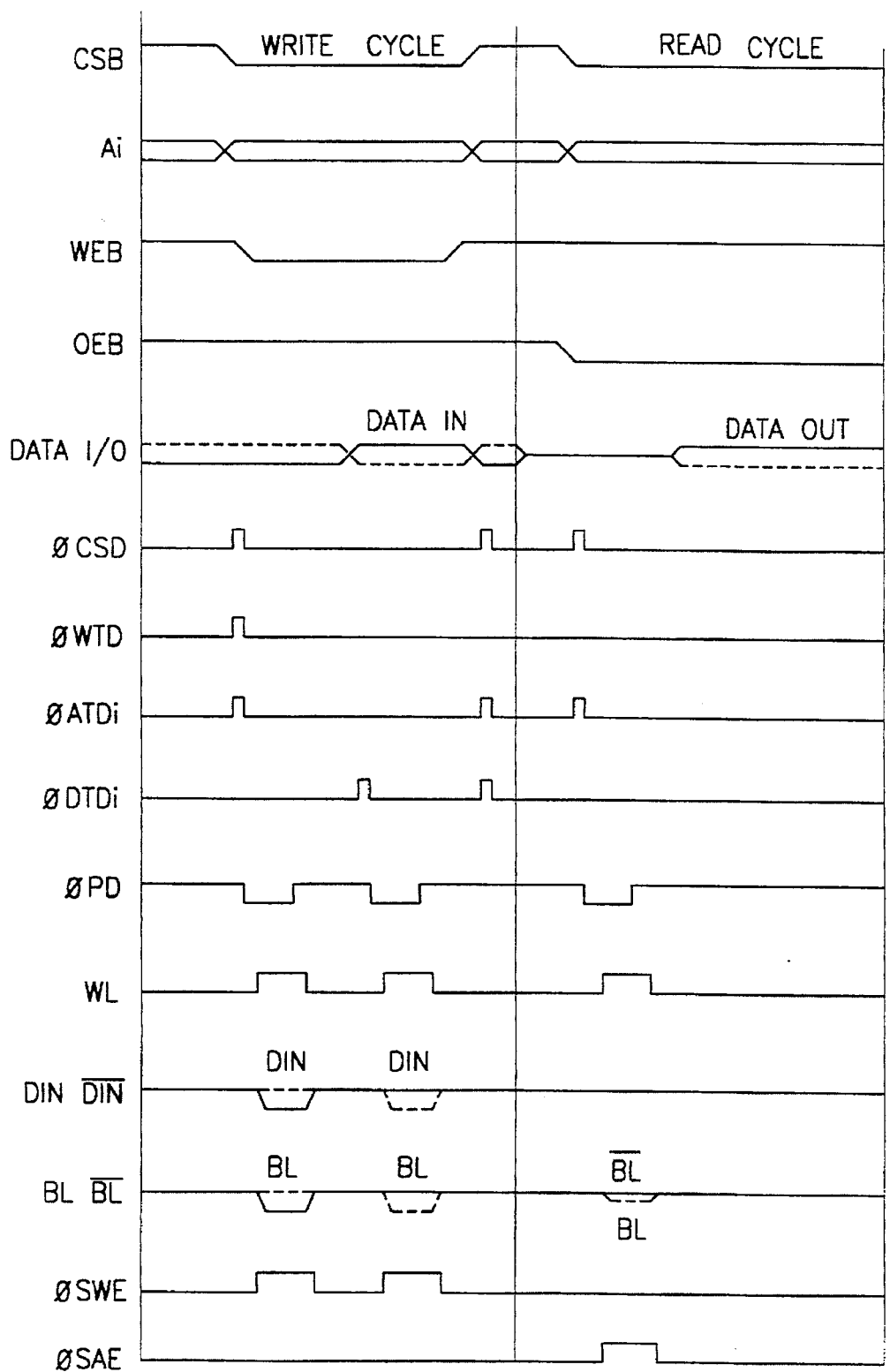
FIG. 3 is a timing diagram showing read and write operations in the circuit shown in FIG. 1.
Figure 7:
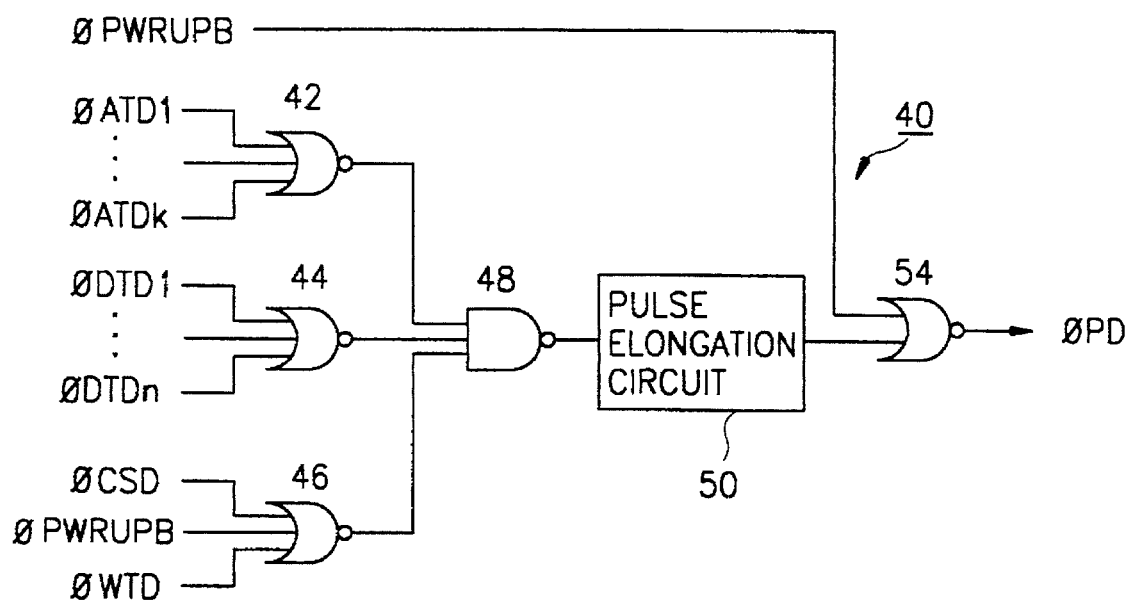
FIG. 7 is a circuit diagram of a power-down timer employed in the circuit of FIG. 5.

Referring to FIG. 7, the power-down timer 40 according to the present invention receives the power-up detecting signal φPWRUPB with a NOR gate 54 which generates the power-down signal φPD. The other input terminal of the NOR gate 54, but that for receiving the power-down signal φPD, is connected to an output terminal of a pulse elongation circuit 50. Like the configuration illustrating in FIG. 2, the address transition detecting signals φATD1 to φATDk are applied to a NOR gate 42, the data input detecting signals φDTD1 to φDTDn to a NOR gate 44 and chip selection detecting signal φCSD and the write mode detecting signal φWTD both to a NOR gate 46. Output terminals of the NOR gates 42, 44 and 46 are connected to input terminals of a NAND gate 48 which generates a logical combination signal to the pulse elongation circuit 50. Thus, power-down signal φPD can be generated with an efficient value only when the power-up detecting signal φPWRUPB is applied to the NOR gate 54 as high level. The power-up detecting signal φPWRUPB of low level of course does not permit the NOR gate 54 to be in a receipt condition for responding to transitions with the detecting signals.

Figure 8:
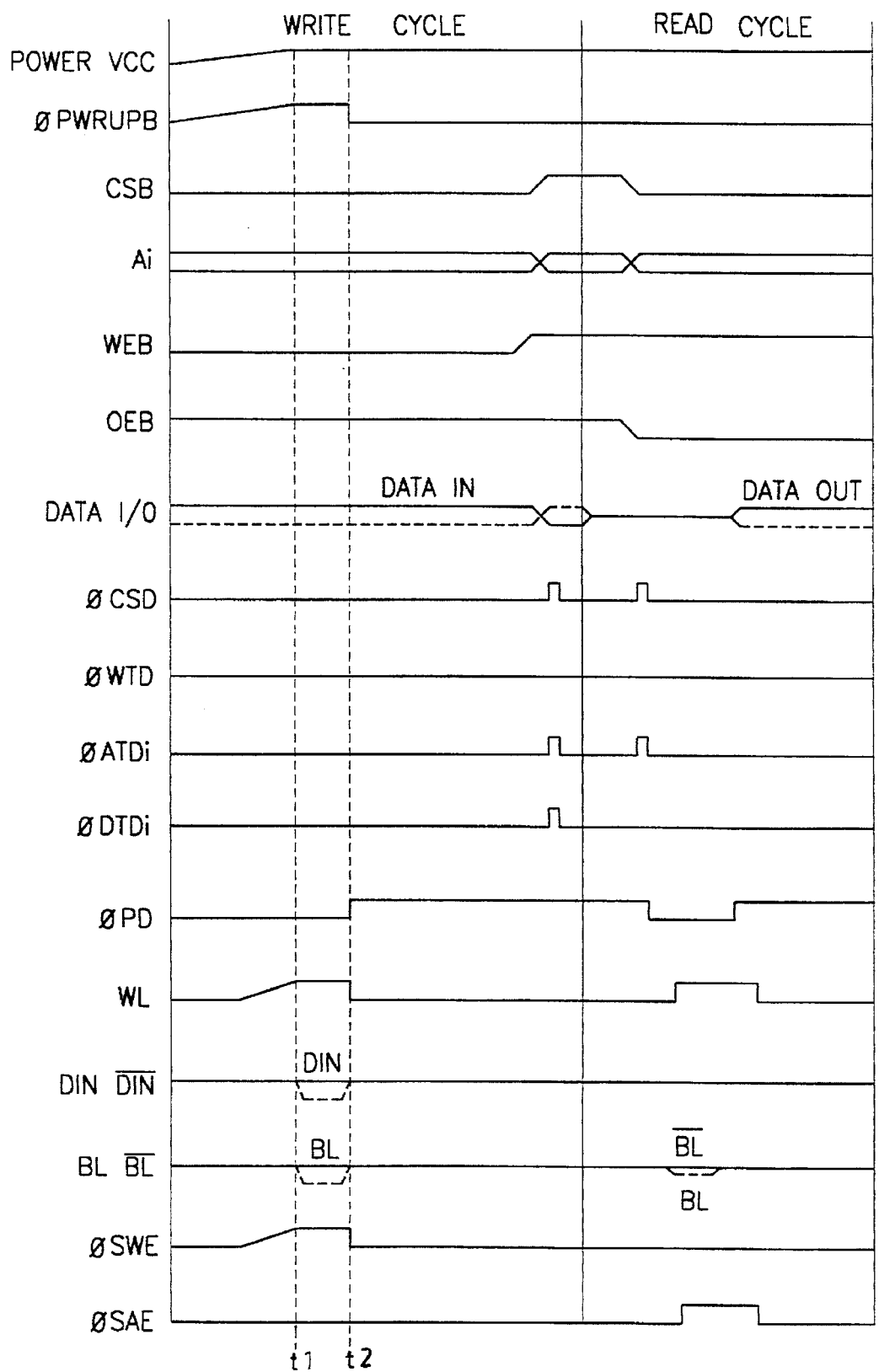
FIG. 8 is a timing diagram according to the present invention when a power supply voltage is initially applied from an external system into the circuit of FIG. 5.

FIG. 8 shows overall timing skews in the write and read cycles, employing the power-up detecting scheme according to the present invention. In the write cycle, if at the time t2 the power-up detecting signal φPWRUPB becomes low level as described relevant to the FIG. 6A and 6B, the NOR gate 54 in the power-down timer 40 is enabled. Thus, the power-down signal φPD is generated as high level in response to the power-up detecting signal φPWRUPB and the other detecting signals being placed on low levels due to no transitions.

It should be noted that, heretofore, a word line WLi (i=1 to n) selected by a row decoding signal from the row decoder 3 is admitted to be sufficiently activated during the period from t1 to t2 with the high leveled power-up detecting signal φPWRUPB. And, since the power-up detecting signal φPWRUPB of high level retaining the term from t1 to t2 makes both the NOR gate 17 and the data input circuit 29 be enabled, the write switching signal φSWE, the data line pair DL/DLB and a bit line pair BLif/BLiB all can be activated so that a normal write operation can be conducted thereby. At this time, though the high leveled power-up detecting signal φPWRUPB permits the NOR gate 31 to be conducted, an efficient sense amplifier enable signal φSAE can not be generated but being held on low level because the write enable signal WE retains high level (WEB is on low level).

Figure 4:
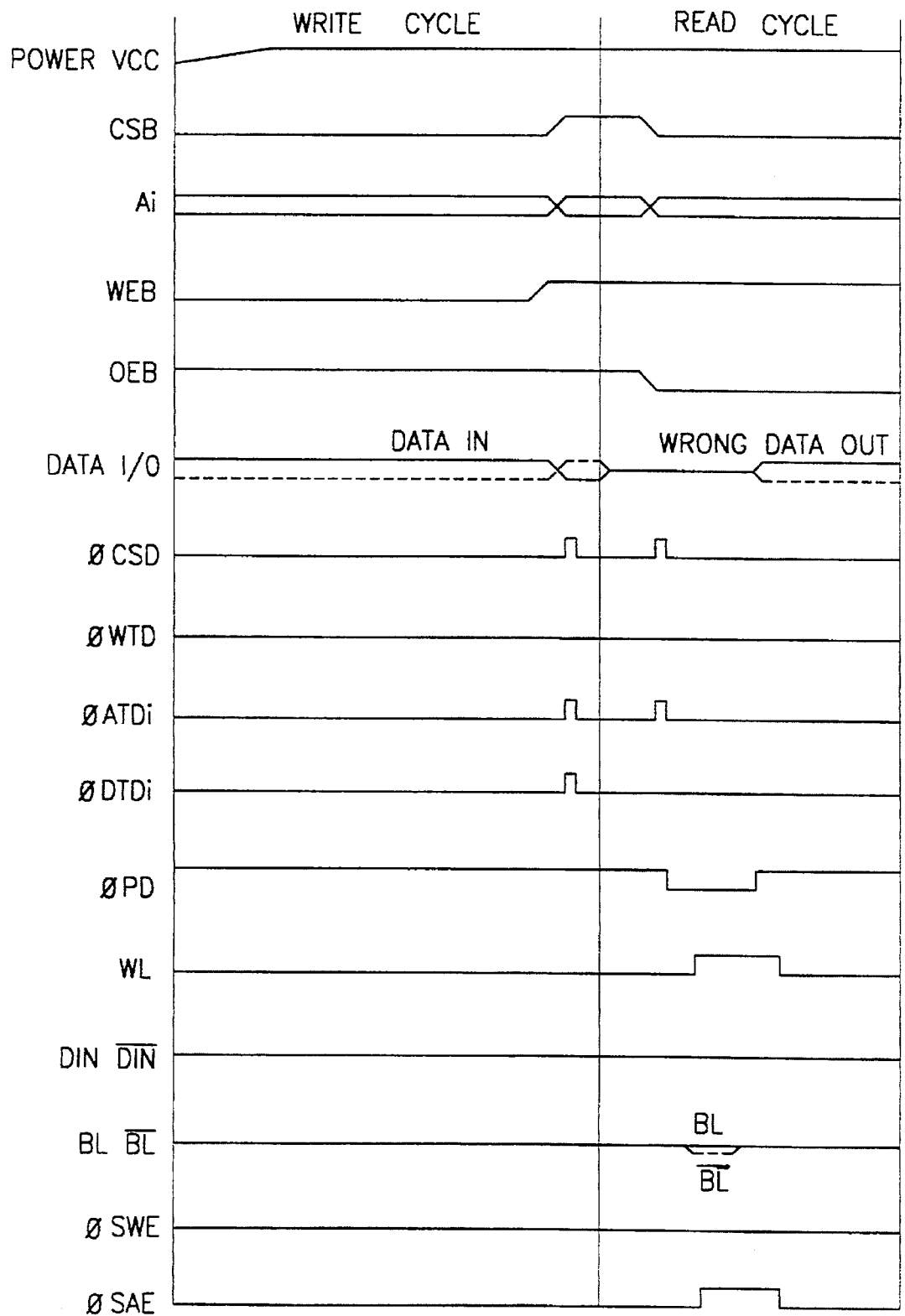
FIG. 4 is a timing diagram showing an abnormal status when a power supply voltage is initially applied from an external system into the circuit of FIG. 1.

Therefore, even in a read cycle subsequent to the write cycle, a data bit read out from a selected memory cell is an efficient data bit which has been stored in the pre-performed write cycle with the normal addressing and data accessing sequence. It will be understood that subsequent operations after the generations relevant to the power-up detecting signal φPWRUPB are the same with those in FIG. 4.

As described above, the reliable generation with the power-up detecting signal provides a static random access memory device directing with low power consumption to be free from the abnormal read/write operations when the power supply voltage is applied thereto for the first time.

Although illustrative embodiments of the present invention have been described in detail herein with reference to the accompanying drawings, it is to be understood that the present invention is not limited to those precise embodiments, and that various changes and modifications can be effected therein by one skilled in the art without departing from the scope and spirit of the present invention, as defined in the appended claims.

What is claimed is:

1. A static random access memory device having a power-down timer for generating a power-down signal in response to a plurality of address transition detecting signals from an address transition detector, data input detecting signals from a data transition detector, and a chip selection detecting signal and a write mode detecting signal from a write mode detector, said device including:
   a power-up detector coupled for receiving a power supply voltage and a ground voltage such that said power-up detector generates a power-up detecting signal of a predetermined potential for a predetermined period of time in response to a change in voltage potential of the power supply voltage, wherein
   the power-down timer and said power-up detector are coupled to each other such that the power-down signal of the power-down timer is triggered in response to said power-up detecting signal of said predetermined potential from said power-up detector.

2. A static random access memory device according to claim 1, wherein said power-up detector comprises a capacitor connected between said power supply voltage and a first node, a threshold switch connected between said first node and a second node, an inverter chain connected between said second node and an output terminal where said power-up detecting signal is generated therefrom, and a means for stabilizing an voltage level of said power-up detecting signal after a predetermined period.

3. A static random access memory device according to claim 2, wherein said threshold switch is a p-channel MOS transistor in which both a gate and a drain are coupled to said second node in common and a source is coupled to said first node.

4. A static random access memory device according to claim 2, wherein said means is made of a p-channel MOS transistor in which a gate is coupled to said output terminal and a channel is interposed between said power supply voltage and said second node.

5. A static random access memory device according to claim 2, further comprising a normally conductive p-channel MOS transistor connected between said power supply voltage and said first node, and a capacitor connected between said second node and said ground voltage.

6. A static random access memory device according to claim 2, wherein said second node is coupled to a third node through an inverter of said inverter chain and a capacitor is connected between said third node and said power supply voltage.

7. A static random access memory device having:

a power up detector configured to receive a power supply voltage and to generate a power-up detecting signal of a predetermined potential for a predetermined period of time in response to a change in magnitude of said power supply voltage between two values; and a power-down timer for generating a power-down signal, said power-down timer being responsive to a plurality of address transition detecting signals and data input detecting signals, a chip selection detecting signal, and a write mode detecting signal only after said power-up detecting signal of said predetermined potential is received by said power-down timer from said power-up detector.

8. A memory device comprising:

a) a plurality of wordlines and bitlines;

b) a plurality of memory cells arranged in a matrix configuration, and coupled to said plurality of wordlines and bitlines;

c) means for at least one of reading data from said plurality of memory cells and writing data into said plurality of memory cells, wherein said means includes a power-down timer for generating a power-down signal suck that corresponding wordlines are conductive for at least one of reading and writing operations; and d) a power-up detector coupled for receiving first and second voltage potentials suck that said power-up detector generates a power-up detecting signal of a predetermined potential for a predetermined period of time in response to a change in potential of one of said first and second voltage potentials, wherein the power-down timer is triggered in response to said power-up detecting signal of said predetermined potential from said power-up detector.

9. The memory device of claim 8, wherein said means further comprises:

an address transition detector responsive to a transition of an address bit to generate an address transition detecting signal, a data transition detector responsive to a transition of data to generate a data detecting signal, and a mode detector for generating at least one or a chip selecting signal and a mode detecting signal, wherein said power-down timer is responsive to at least one of said address transition detecting signal, said data detecting signal, said chip selecting signal and said mode detecting signal only after receiving said power-up detecting signal from said power-up detector.

10. The memory device of claim 8, wherein said power-up detector comprises a first capacitor coupled between said first voltage potential and a first node;

a threshold switch coupled between said first node and a second node;

an inverter chain coupled between said second node and an output node for providing said power-up detecting signal; and means for stabilizing said power-up detecting signal to said predetermined potential for the predetermined period of time.

11. The memory device of claim 10, wherein said threshold switch comprises a first transistor having firs: and second electrodes and a control electrode, said control and second electrodes being commonly coupled to said second node, and said first electrode being coupled to said first node.

12. The memory device of claim 11, wherein said stabilizing means comprises a second transistor having first and second electrodes and a control electrode, said control electrode being coupled to said output node, and said first and second electrodes being coupled to said first voltage potential and said second node, respectively.

13. The memory device of claim 12, further comprising:

a third transistor coupled between said first voltage potential and said first node, and a second capacitor coupled between said second node and said second voltage potential.

14. The memory device of claim 13, wherein said second node is coupled to a third node through an inverter of said inverter chain, and a third capacitor is coupled between said third node and said first voltage potential.

* * * * *